US009112501B2

(12) United States Patent
Norling (10) Patent No.: US 9,112,501 B2
(45) Date of Patent: Aug. 18, 2015

(54) ELECTRONIC CIRCUIT WITH AN ELECTRONIC SWITCH AND A MONITORING CIRCUIT

(71) Applicant: Infineon Technologies AG, Neubiberg (DE)

(72) Inventor: Karl Norling, Villach (AT)

(73) Assignee: Infineon Technologies AG, Neubiberg (DE)

( * ) Notice: Subject to any disclaimer, the term of this patent is extended or adjusted under 35 U.S.C. 154(b) by 500 days.

(21) Appl. No.: 13/631,922

(22) Filed: Sep. 29, 2012

(65) Prior Publication Data

US 2014/0091643 A1    Apr. 3, 2014

(51) Int. Cl.
*H01H 47/00* (2006.01)
*H03K 17/18* (2006.01)
*H03K 17/082* (2006.01)

(52) U.S. Cl.
CPC ............ *H03K 17/18* (2013.01); *H03K 17/0822* (2013.01); *H03K 2217/0027* (2013.01)

(58) Field of Classification Search
CPC .......... H03K 17/08; H03K 2017/0806; H03K 17/08104; H03K 17/08112; H03K 17/0812; H03K 17/08122; H03K 17/0814; H03K 17/08142; H03K 17/08146; H03K 17/082; H03K 307/13
USPC .................. 324/537, 762.01, 762.08, 762.09; 307/130
See application file for complete search history.

(56) References Cited

U.S. PATENT DOCUMENTS

| 2002/0141126 | A1* | 10/2002 | Tabata | 361/93.7 |
| 2011/0210711 | A1* | 9/2011 | Pelz et al. | 323/283 |
| 2014/0028213 | A1* | 1/2014 | Sood et al. | 315/210 |
| 2014/0321178 | A1* | 10/2014 | Cyr et al. | 363/131 |

* cited by examiner

*Primary Examiner* — Daniel Cavallari
(74) *Attorney, Agent, or Firm* — Slater & Matsil, L.L.P.

(57) ABSTRACT

An electronic circuit includes an electronic switch having a control terminal and a load path. A monitoring circuit includes a switched-capacitor circuit with a capacitive storage element. The switched-capacitor circuit is coupled to the load path of the electronic switch. The monitoring circuit is operable to evaluate a load voltage of the electronic switch and to generate a failure signal dependent on the evaluation. A drive circuit is operable to provide a drive signal at the control terminal of the electronic switch dependent on the failure signal.

17 Claims, 8 Drawing Sheets

ELECTRONIC CIRCUIT WITH AN ELECTRONIC SWITCH AND A MONITORING CIRCUIT

TECHNICAL FIELD

The present disclosure relates to an electronic circuit with an electronic switch and with a monitoring circuit.

BACKGROUND

In many electronic circuit applications, such as power converters, semiconductor switches (also referred to as solid state switches) are used. Semiconductor switches are, e.g., MOSFETs (Metal Oxide Semiconductor Field-Effect Transistors), IGBTs (Insulated Gate Bipolar Transistors), JFETs (Junction Field-Effect Transistors), BJTs (Bipolar Junction Transistors) or HEMTs (High Electron-Mobility Transistors). In operation of an electronic switch, different types of failures may occur, such as a short-circuit of a load connected to the switch. In order to prevent the electronic switch from being damaged in case of a failure, at least one operation parameter of the electronic switch may be monitored and suitable measure may be taken, such as switching off the electronic switch, when the operation parameter indicates that a failure has occurred.

On device parameter that may be monitored is a load-path voltage of the electronic switch. In an IGBT or a BJT, the load-path voltage is a collector-emitter voltage ($V_{CE}$), in a MOSFET or JFET, the load path voltage is a drain-source voltage ($V_{DS}$). The load-path voltage is dependent on a load current through the electronic switch and increases as the load current increases when the load current is below a nominal current, that is when the electronic switch is operated in a linear region (ohmic region) of its characteristic curve. At higher load currents, that is when an IGBT is operated in the desaturation region of its characteristic curve, or when a MOSFET, a JFET or a HEMT is operated in the saturation region (pinch-off region) of its characteristic curve, the load-path voltage may dramatically increase which may cause the electronic switch to be damaged or even destroyed, unless suitable measures are taken.

For normally off devices such as, e.g., MOSFETs or IGBTs, that have a driver with a positive power supply, there are several known solutions to implement a protection circuit that monitors an operation parameter and switches off the electronic switch in case of a failure. These solutions use the positive power supply which is available anyway. These solutions, however, may not be suitable to be used for normally-on devices such as, e.g., JFETs or HEMTs. Normally-on devices have a driver with a negative power supply. Therefore, there might not be a positive power supply available or there is only a positive power supply available that does not provide a positive supply voltage that is high enough to implement the same protection circuitry as used for normally-off devices.

The cost for providing an additional power supply for the protection circuitry of normally-on devices can be very high, and deriving a positive supply voltage for the protection circuitry from a higher supply voltage of the load can be very power consuming and/or expensive.

There is therefore a need for a circuit including an electronic switch and a monitoring circuit that is less expensive, less power consuming and easy to be implemented.

SUMMARY OF THE INVENTION

A first embodiment relates to an electronic circuit. The electronic circuit includes an electronic switch having a control terminal and a load path, a monitoring circuit including a switched-capacitor circuit with at least one capacitive storage element, the switched-capacitor network coupled to the load path of the electronic switch, the monitoring circuit operable to evaluate a load voltage of the electronic switch and to generate a failure signal dependent on the evaluation, and a drive circuit operable to provide a drive signal at the control terminal of the electronic switch dependent on the failure signal.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following Detailed Description, reference is made to the accompanying drawings, which form a part thereof, and in which is shown by way of illustration specific embodiments in which the invention may be practiced.

Figure 1:
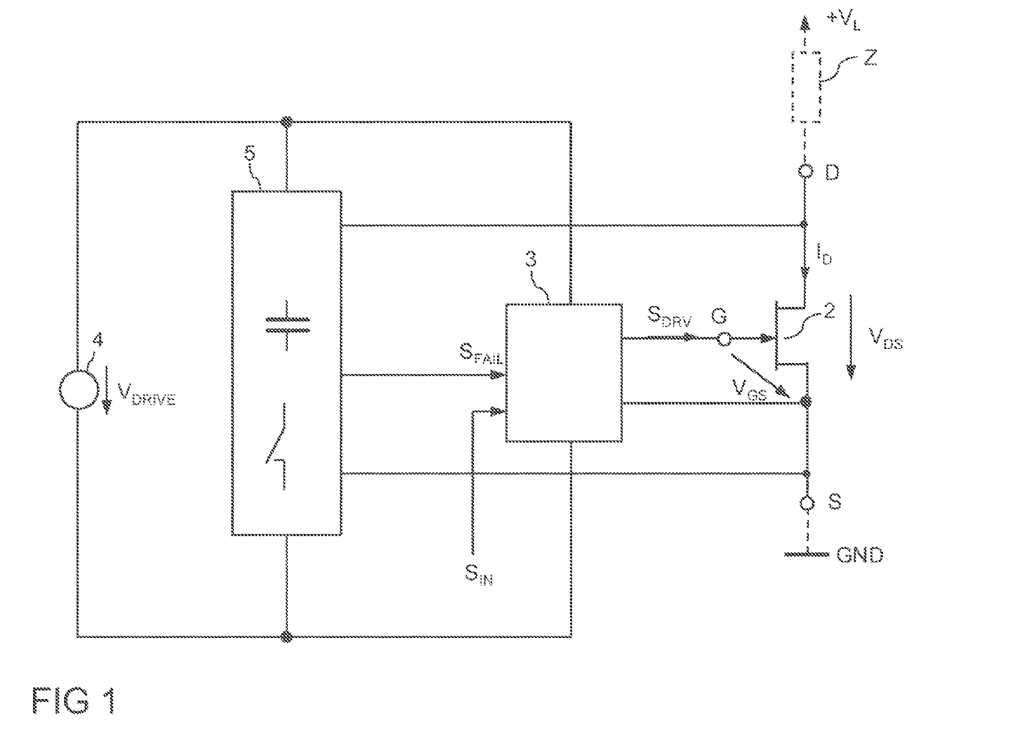
FIG. 1 illustrates a circuit including an electronic switch, a driver circuit and a monitoring circuit according to a first embodiment.

FIG. 1 illustrates a first embodiment of an electronic circuit that includes an electronic switch 2, a drive circuit 3 for the electronic switch 2, a supply voltage source 4 and a monitoring circuit 5. In this example, the electronic switch is a normally-on device, specifically a JFET 2. However, the electronic switch is not restricted to be implemented as a normally-on device. Further, the normally-on device is not restricted to be implemented as a JFET, but could be implemented as one of a depletion MOSFET and a HEMT as well.

The electronic switch 2 has a control terminal and a load path between a first and a second load terminal. In the JFET 2 of FIG. 1, the load path is a drain-source path D-S between a drain terminal D and a source terminal S, and the control terminal is a gate terminal G. The electronic switch 2 can be used for switching an electrical load Z (illustrated in dashed lines), such as an electrical load in an automotive, industrial or consumer electronic application. In this case, the load path of the switch is connected in series with load Z, where the series circuit with the load and the electronic switch is connected between a terminal for a positive supply potential $+V_L$ and a terminal for a negative supply potential, or reference potential, such as ground. A load supply voltage $V_L$ is a voltage between the terminals for the positive and the negative supply potential. The load supply voltage $V_L$ is dependent on the supply voltage required by the load. For example, the supply voltage is a voltage between several 10V and several 100V dependent on the type of load.

In the embodiment of FIG. 1, the electronic switch 2 is a low-side switch. That is, the switch is connected between the load Z and the terminal for the negative supply potential GND. However, this is only an example. The electronic switch 2 could be interconnected as a high-side switch as well. In this case, the electronic switch 2 is connected between the terminal for the positive supply potential and the load Z.

Referring to FIG. 1, a drive circuit 3 controls the electronic switch 2. The drive circuit 3, receives an input signal $S_{IN}$ and, in a normal operation mode, switches the electronic switch 2 on and off dependent on the input signal $S_{IN}$. When the electronic switch 2 is switched on, the load voltage $V_L$ mainly drops across the load Z, while the load voltage $V_L$ drops across the electronic switch 2 when the electronic switch 2 is switched off. The electronic switch 2 is chosen such that a voltage blocking capability of the electronic switch 2 is higher than the load voltage $V_L$.

The drive circuit 3 may be a conventional drive circuit for driving an electronic switch and generates a drive signal $S_{DRV}$ from a drive voltage $V_{DRIVE}$ received at supply terminals. A supply voltage source 4 provides the drive voltage $V_{DRIVE}$. The JFET 2, like a depletion MOSFET and a HEMT, is a voltage controlled semiconductor device, so that the drive signal $S_{DRV}$ is a voltage (gate-source voltage, $V_{GS}$) between the gate terminal G and the source terminal S of the JFET 2. A depletion JFET, like a depletion MOSFET and a HEMT, is a normally-on device that is in an on-state (switched on) when the gate-source voltage is zero, while a gate-source voltage other than zero needs to be applied between gate and source in order to switch of the JFET. In an n-type JFET, the gate-source voltage for switching off is a negative voltage. That is, the threshold voltage of the JFET is a negative voltage, and the gate-source voltage for switching off needs to be below the negative threshold voltage.

For explanation purposes it is assumed that the supply voltage $V_{DRIVE}$ is a positive voltage. In this case, the drive circuit 3 may be configured to generate a gate-source voltage $V_{GS}=0V$ in order to switch on the JFET when the input signal $S_{IN}$ has an on-level, and to generate a gate-source voltage $V_{GS}=-V_{DRIVE}$ in order to switch off the JFET when the input signal $S_{IN}$ has an off-level, and when the JFET is in a normal operation mode.

When the electronic switch 2 is used as explained with reference to FIG. 1 for switching an electrical load, a failure may occur causing both a current $I_D$ through the electronic switch 2 and a voltage $V_{DS}$ across the electronic switch to increase. An increase of the current $I_D$ through the electronic switch 2 and of a voltage $V_{DS}$ across the electronic switch 2 results in an increase of the electrical power dissipated in the electronic switch and in an increase in the device temperature. The electronic switch 2 may be damaged or even destroyed when the electrical power dissipated in the electronic switch 2 reaches a critical value. In order to detect a failure condition, the circuit includes a monitoring circuit 5 that is configured to evaluate the load voltage $V_{DS}$ of the electronic switch and to generate a failure signal $S_{FAIL}$. According to one embodiment, the monitoring circuit 5 is configured to generate the failure signal $S_{FAIL}$ with one of two different signal levels, namely a failure level when a failure condition is detected, or a normal level when a normal operation condition is detected. According to one embodiment the monitoring circuit 5 compares a magnitude of the load voltage $V_{DS}$ with a reference voltage and generates the failure signal $S_{FAIL}$ with the normal level when the load voltage $V_{DS}$ is below the reference voltage and generates the failure signal with the failure level when the load voltage $V_{DS}$ is above the reference voltage. The monitoring circuit 5 includes a switched capacitor network with one or more capacitive storage elements and a switching circuit for evaluating the load voltage. Embodiments of the monitoring circuit 5 are explained below.

Referring to FIG. 1, drive circuit 3 receives the failure signal $S_{FAIL}$. According to one embodiment, the drive circuit 3 is configured to switch off the electronic switch 2 when the failure signal $S_{FAIL}$ has a failure level. When the failure signal $S_{FAIL}$ has normal level, the drive circuit switches the electronic switch 2 on and off dependent on the input signal S.

Figure 2:
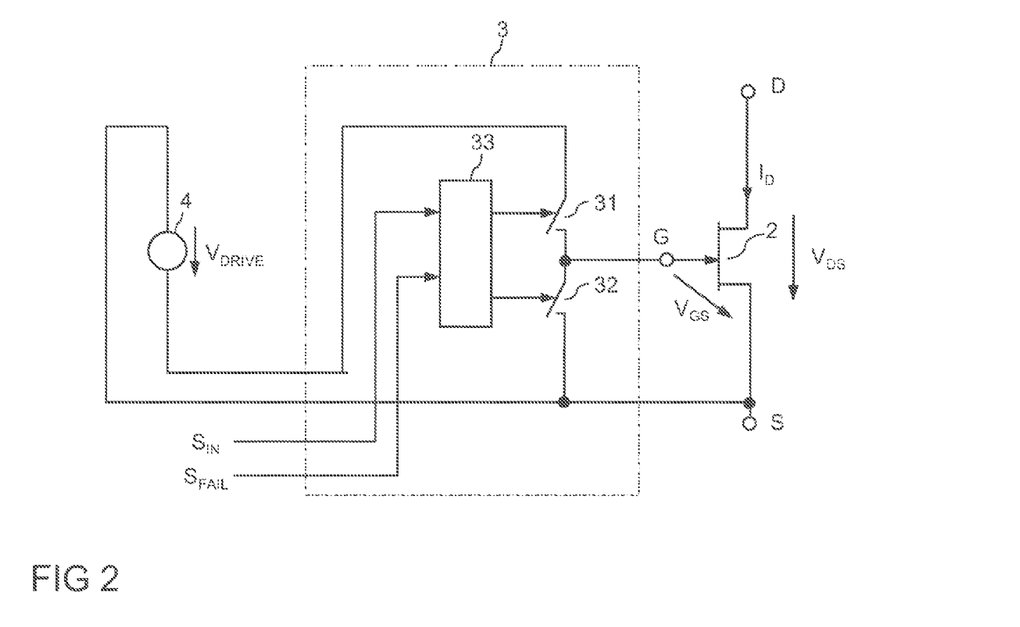
FIG. 2 illustrates a first embodiment of the driver circuit.

Just to ease better understanding of the operating principle of the drive circuit 3, one embodiment of the drive circuit 3 is illustrated in FIG. 2. In FIG. 2, besides the drive circuit 3 the electronic switch 2 and the supply voltage source 4 are also illustrated. The drive circuit 3 includes a first switch 31, a second switch 32 and a control circuit 33 configured to control the first and second switches 31, 32. The control circuit 33 receives the input signal and the fail signal and switches the first and second switches 31, 32 dependent on these signals $S_{IN}$, $S_{FAIL}$.

Referring to FIG. 2, one of a positive and a negative supply terminal of the supply voltage source 4 is coupled to the source terminal S of the JFET 2 via the drive circuit 3, while the other one of the positive and the negative supply terminals is coupled to the gate terminal G via the first switch 31. In the embodiment of FIG. 2, the positive supply terminal of the supply voltage source 4 is coupled to the source terminal S, while the negative supply terminal is coupled to the gate terminal via the first switch 31. The second switch 32 is coupled between the gate and the source terminals G, S. The control circuit 33 is configured to switch on and off the first and second switches 31, 32 complementarily. That is, only one of the first and second switches is switched on at the same time, where there may be time delay (dead time) between switching off one of the first and second switches and switching on the other one of the first and second switches in order to definitely prevent a short circuit of the supply voltage source 4.

The operating principle of the drive circuit is as follows. The control circuit 33 switches off the first switch 31 and switches on the second switch 32 when the input signal $S_{IN}$ changes state from the off-level to the on-level (indicating that it is desired to switch on the JFET) and when the failure signal $S_{FAIL}$ has a normal level (indicating that no failure has been detected). In this case, the gate-source voltage $V_{GS}$ is approximately zero, so that the JFET is switched on. The control circuit 33 switches off the second switch 32 and switches on the first switch 31 when the input signal $S_{IN}$ changes state from on-level to off-level (indicating that it is desired to switch off the JFET) or when the failure signal $S_{FAIL}$ changes state from normal level to failure level (indicating that a failure has been detected). In this case, a magnitude of the gate-source voltage $V_{GS}$ approximately equals the magnitude of the drive voltage $V_{DRIVE}$. By virtue of having the positive supply terminal of the drive voltage source 4 connected to the source terminal S and by virtue of having the negative supply terminal connected to the gate terminal G when the first switch 31 is switched on, the gate-source voltage $V_{GS}$ is negative ($V_{GS}=-V_{DRIVE}$) so that the JFET 2 is switched off.

Figure 3:
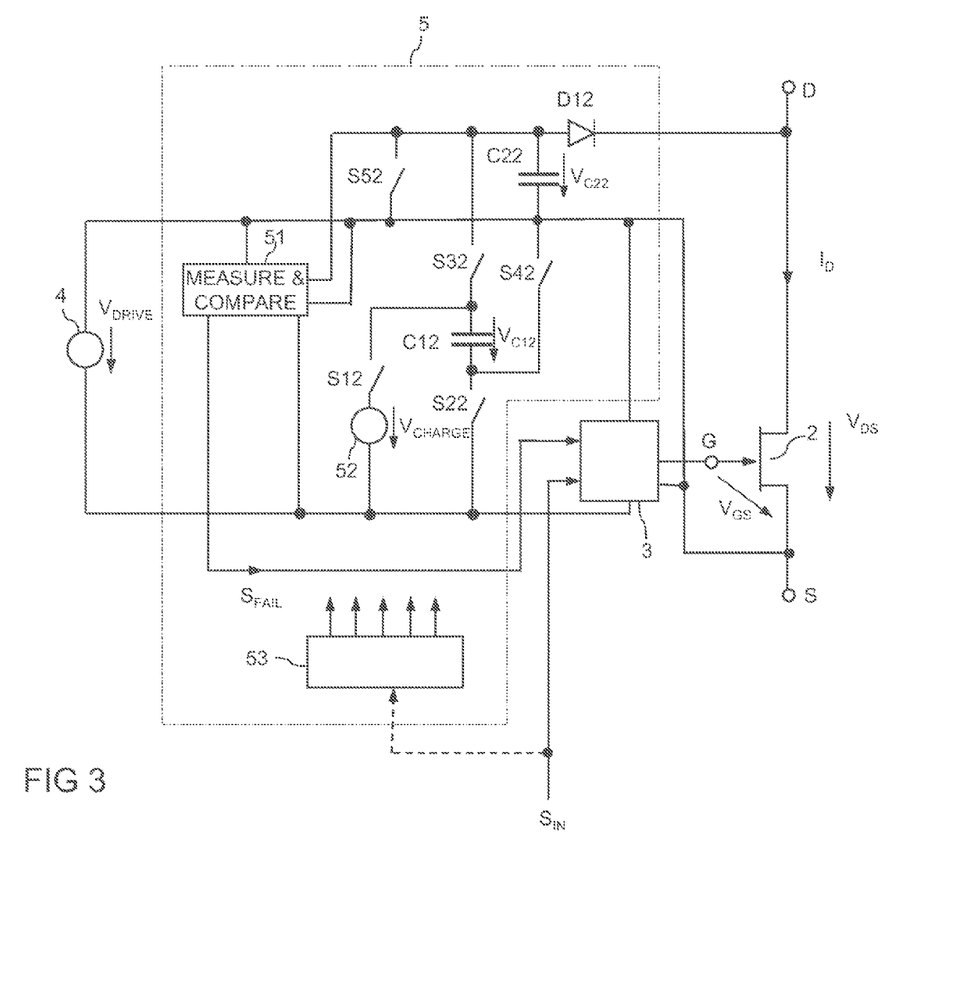
FIG. 3 illustrates the circuit of FIG. 1 implemented with a monitoring circuit according to a first embodiment.

FIG. 3 illustrates a first embodiment of the monitoring circuit 5. The monitoring circuit of FIG. 3 includes a switched-capacitor network with a first capacitive storage element C12, a charging voltage source 52, a first switch network S12, S22 operable to couple the charging voltage source 52 to the first capacitive storage element C12, a second capacitive storage element C22 coupled to the load path of the electronic switch 2, and a second switch circuit operable to couple the first capacitive storage element C12 to the second capacitive storage element C22. One or both of the first and second capacitive storage elements C12, C22 may be implemented as capacitors. The first switch network includes a first switch S12 connected between a first terminal of the charging voltage source and a first terminal of the first capacitive storage element C12, and a second switch S22 connected between a second supply terminal of the charging voltage source 52 and a second terminal of the first capacitive storage element C12. The first supply terminal of the charging voltage source 52 is a positive supply terminal in the present embodiment, and the second supply terminal is negative supply terminal. Further the negative supply terminals of the drive voltage source 4 and the charging voltage source 52 are connected to a common circuit node. However, this is only an example. Basically, the operating principle would be the same if the positive supply terminals of the drive voltage source 4 and the charging voltage source 52 would be connected to a common circuit node. With the switch S12 connected between the negative supply terminal of the charging voltage source 52 and the second terminal of the first capacitive storage element. And the switch S22 connected between the positive supply terminal of the charge voltage source 52 and the first terminal of the first capacitive storage element. Although the drive voltage source 4 and the charging voltage source 52 are drawn as separate voltage sources in FIG. 3, it is also possible to derive the charging voltage $V_{CHARGE}$ provided by the charging voltage source 52 and a drive voltage $V_{DRIVE}$ provided by the drive voltage source 4 from only one voltage source (not shown in FIG. 3).

Referring to FIG. 3, the second switch network includes a third switch S32 connected between the first terminal of the first capacitive storage element C12 and a first terminal of the second capacitive storage element C22, and a fourth switch S42 connected between the second terminal of the first capacitive storage element C12 and a second terminal of the second capacitive storage element C22. The second switch network S32, S42 is operable to connect the first capacitive storage element C12 in parallel with the second capacitive storage element C22. The second capacitive storage element C22 is connected in parallel with the load path D-S of the electronic switch 2, where the first terminal of the second capacitive storage element C22 is coupled to the drain terminal D and the second terminal of the second capacitive storage element C22 is coupled to the source terminal S of the electronic switch implemented as a JFET. A rectifier element D12 such as a diode is connected between the second capacitive storage element C22 and load path D-S. The rectifier element D12 is connected such that the second capacitive storage element C22 cannot be charged from the load path but can be discharged to the load path via the rectifier element D12.

A control circuit 53 controls the operation of the first and second switch network. The first switch network is activated when the first and second switches S12, S22 are switched on so as to connect the first capacitive storage C12 element to the charging voltage source 52, and the second switch network is activated when the third and fourth switches S32, S42 are switched on so as to connect the first capacitive storage C12 element to the second capacitive storage element C22. The control circuit 53 is configured to activate only one of the first and second switch networks at the same time.

Referring to FIG. 3, the monitoring circuit 5 further includes a fifth switch S52 connected in parallel with the second capacitive storage element C22 and also controlled by the control circuit 53, and a measure and compare unit. The measure and compare unit 51 is coupled to the second capacitive storage element C22 to receive a voltage $V_{c22}$ across the second capacitive storage element C22. The measure and compare unit 51 is configured to compare the voltage $V_{c22}$ across the second capacitive with a reference voltage and is configured to generate the failure signal $S_{FAIL}$ dependent on the comparison. According to one embodiment, the measure and compare unit 51 generates a failure level of the fail signal $S_{FAIL}$ when the voltage $V_{c22}$ reaches the reference voltage. Referring to the explanation below, the switched capacitor network is operable to charge the second capacitive storage element such that the voltage $V_{c22}$ across the second capacitive storage element C22 corresponds to the load voltage (minus the forward voltage of the diode D12). According to one embodiment, the reference voltage represents a voltage level of the load voltage $V_{DS}$ that should not be exceeded, so that the measure and compare unit 51 via the drive circuit 3 switches off the electronic switch 2 when the load voltage $V_{DS}$ reaches the reference voltage. According to one embodiment, the reference voltage represents a voltage at which the JFET 2 leaves a linear operation in which the load voltage $V_{DS}$ linearly increases as the load current $I_{DS}$ increases and goes into saturation.

The monitoring circuit 5 operates as follows. The fifth switch S52 is switched on controlled by the control circuit 53 as long as the input signal $S_{IN}$ has an off-level in order to keep the second capacitive storage element discharged. In order to suitably control the switches S12, S22, S32, S42 of the first and second switch network and the fifth switch S52 the control circuit 53 also receives the input signal S. When the input signal $S_{IN}$ changes to an on-level, the drive circuit 3 switches on the electronic switch 2 and the control circuit 53 starts to activate the first and second switch networks alternatingly after switching off the switch S52. Each time the first switch network is activated the first capacitive storage element C12 is charged by the charging voltage source 52 so that a voltage $V_{C12}$ across the first capacitive storage element C12 reaches the charging voltage $V_{CHARGE}$. When the first switch network is deactivated and the second switch network is activated, electrical charge is transferred from the first capacitive storage element C12 to the second capacitive storage element C22 so that the voltage $V_{C22}$ across the second capacitive storage element C22 increases. The voltage $V_{C22}$ across the second capacitive storage element C22 is limited to the load voltage $V_{DS}$ (plus the forward voltage of the diode D12). When the voltage across the second capacitive storage element C22 reaches the load voltage $V_{DS}$ (plus the forward voltage), the second capacitive storage element C22 stops to be charged so that charges from the first capacitive storage element flow through the diode D12 and the load path D-S when the second switch network is active.

The number of activation cycles required to charge the second capacitive storage element C22 to the load voltage $V_{DS}$ is dependent on the capacitive ratio between the first and second capacitive storage elements C12, C22, on the charging voltage $V_{CHARGE}$ and the load voltage $V_{DS}$. The charging voltage $V_{CHARGE}$ is higher than the maximum load voltage $V_{DS}$ so as to be able to charge the second capacitive storage element C22 to a voltage corresponding to the maximum load voltage plus the forward voltage of the diode D12. The maximum load voltage $V_{DS}$ is the voltage at which the monitoring circuit 5 detects a failure condition and switches the electronic switch 2 off. For example, the maximum load voltage $V_{DS}$ is a voltage of between i.e., 6 to 12V, while the load voltage $V_{DS}$ is usually much lower, such as between −5 to 3V, when the electronic switch 2 is operated under normal operation conditions.

Figure 4:
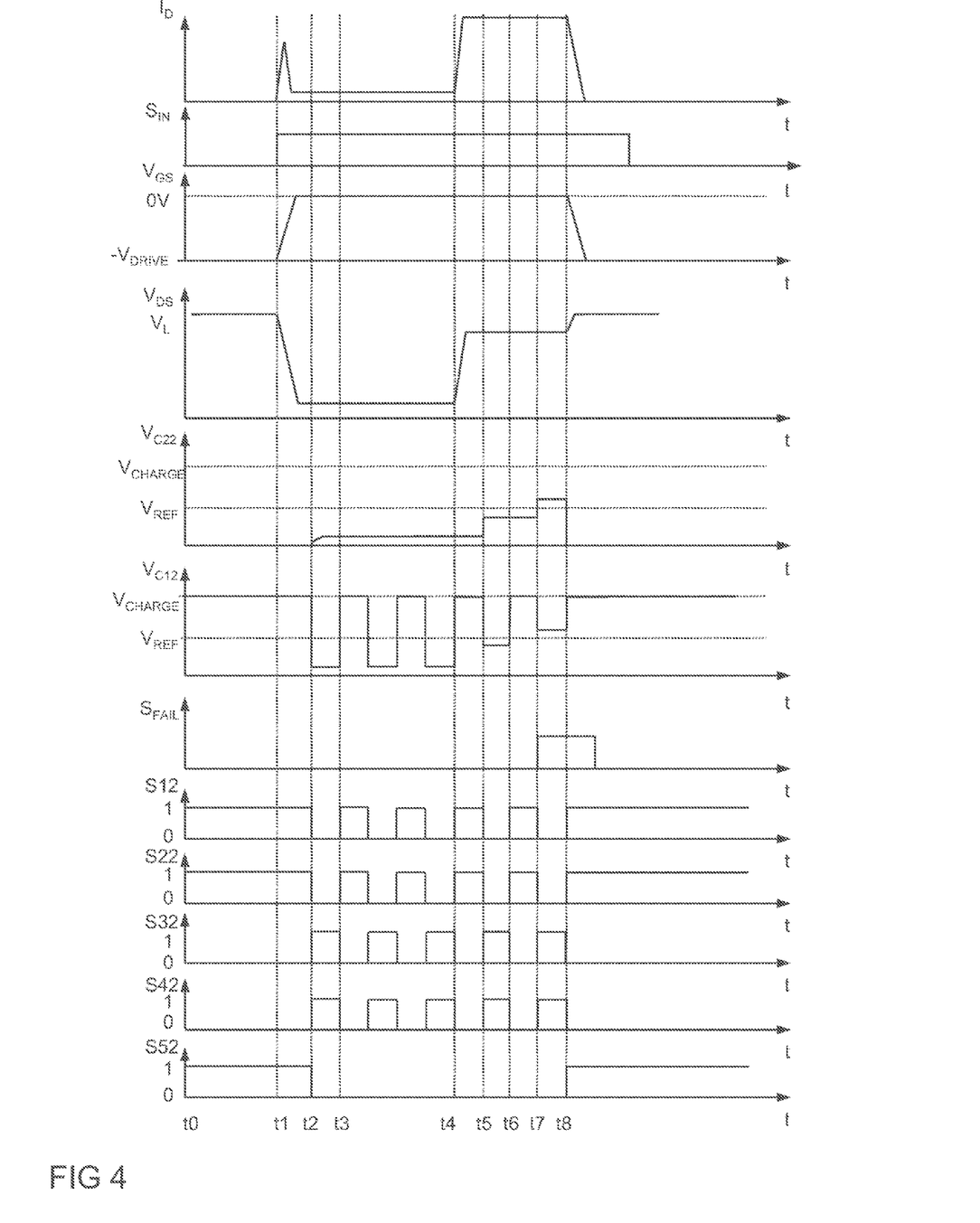
FIG. 4 shows timing diagrams illustrating the operating principle of the circuit of FIG. 3.

FIG. 4 shows timing diagrams of the load current $I_D$, the input signal $S_{IN}$ the gate-source voltage $V_{GS}$, the drain-source voltage $V_{DS}$, the voltages $V_{C12}$, $V_{C12}$ across the first and second capacitive storage elements C12, C22, the failure signal $S_{FAIL}$ and the switching states of the switches S12-S52 in order to further illustrate the operating principle of the monitoring circuit 5. In the timing diagrams of FIG. 4 a high signal level of the input signal $S_{IN}$ represents an on-level, while a low signal level represents an off-level. Further, a high level (logical "1") of the switching states of the individual switches S12-S52 represents an on-state and a low level (logical "0") represents an off-state. The timing diagrams begin at a time t0 at which the electronic switch 2 is in its off state so that the load current $I_D$ is zero, the load voltage $V_{DS}$ corresponds to the load supply voltage $V_{DS}$ and the gate-source voltage corresponds to the negative drive voltage $-V_{DRIVE}$. The first switch network is activated at this time so that the first second switches S12, S22 are switched on, while the second switch network is deactivated (third and fourth switches S32, S42 are switched off). The fifth switch S52 is switched on at this time t0. When the input signal $S_{IN}$ changes state at time instance t1, the electronic switch 2 is switched on by applying an appropriate drive voltage between the gate and source terminals G, S. The gate source voltage $V_{GS}$ therefore rises from the negative supply voltage $-V_{DRIVE}$ to 0V after time t1 in the present embodiment. The drain current $I_D$ increases to a steady current value after the electronic switch 2 switches on, wherein a transitional current spike may occur at the beginning, and the load voltage $V_{DS}$ decreases to a steady voltage.

After the time t1, the first and second switch networks are activated cyclically and alternatingly so that the voltage $V_{C22}$ increases. The first capacitive storage element C12 is charged to the charging voltage $V_{CHARGE}$ each time the first switch network is activated, e.g., between times t1 and t2 in FIG. 4. The first capacitive storage element C12 is discharged each time the second switch network is activated, e.g., between times t2 and t3 in FIG. 4. Referring to FIG. 4, the charging voltage $V_{CHARGE}$ is higher than the reference voltage $V_{REF}$ which is also shown in FIG. 4.

For explanation purpose it is assumed that the electronic switch 2 is in a normal operation mode between times t1 and t4. In the normal operation mode, the load voltage $V_{DS}$ is below a maximum (critical voltage) so that the voltage $V_{C22}$ across the second capacitive storage element C22 is below the reference voltage $V_{REF}$. The second capacitive storage element C22 may be charged to the load voltage $V_{DS}$ (plus the forward voltage of the diode D12) in the first activation cycle so that in further activation cycles the first capacitive storage element C12 is only discharged via the diode D12 and the load path D-S. However, it is possible for the second capacitive storage element C22 not to be charged in the first activation cycle, but to be charged in a sequence of several activation cycles.

Referring to FIG. 4, a failure occurs at time t4 that causes the load current $I_D$ and the load voltage $V_{DS}$ to increase. The increase of the load voltage $V_{DS}$ causes the voltage $V_{C22}$ across the second capacitive storage element C22 to increase when the second switch network is activated, which is at time t5 in FIG. 4. Even though the load voltage $V_{DS}$ may stay constant (on a high voltage level) after the failure occurs, it may take several activation cycles of the first and second switch networks until the second capacitive storage element C22 has been charged to a voltage corresponding to the load voltage $V_{DS}$ (plus the forward voltage of the diode D12). The number of activation cycles that is required may be adjusted dependent on a ratio between the capacitances of the first and second capacitive storage elements C12, C22 and the difference between the charge voltage 52 and the load voltage $V_{DS}$ (plus the forward voltage of the diode D12). A time delay between the time when the load voltage $V_{DS}$ reaches a higher level and a time when the second capacitive storage element has been charges accordingly is dependent on the number of required activation cycles and a switching frequency, which is a frequency at which the first and second switch networks are activated and deactivated. This switching frequency may be adjusted dependent on a desired maximum delay.

The electronic switch 2 is switched off after the voltage $V_{C22}$ across the second capacitive storage element C22 reaches the reference value $V_{REF}$. In the embodiment of FIG. 4, the voltage $V_{C22}$ across the second capacitive storage element C22 reaches the reference value $V_{REF}$ at time t7 so that the failure signal $S_{FAIL}$ assumes the failure level. The electronic switch 2 is switched off at time t8. There may be a time delay (as illustrated) between the time at which the failure signal $S_{FAIL}$ assumes a failure level, and the time at which the electronic switch 2 switches off. This time delay may result from propagation delays in the monitoring circuit 5, in particular the measure and compare unit 51, and the drive circuit 3.

The rise time of the voltage $V_{C22}$ of the second capacitor C22 generally depends on the difference in capacitance value of the capacitors C12 and C22, the charging voltage $V_{CHARGE}$ and the switching frequency. In one embodiment, trimming of the switching frequency, the capacitance ratio or the $V_{CHARGE}$ voltage can be used to maintain an accurate rise time.

Figure 5:
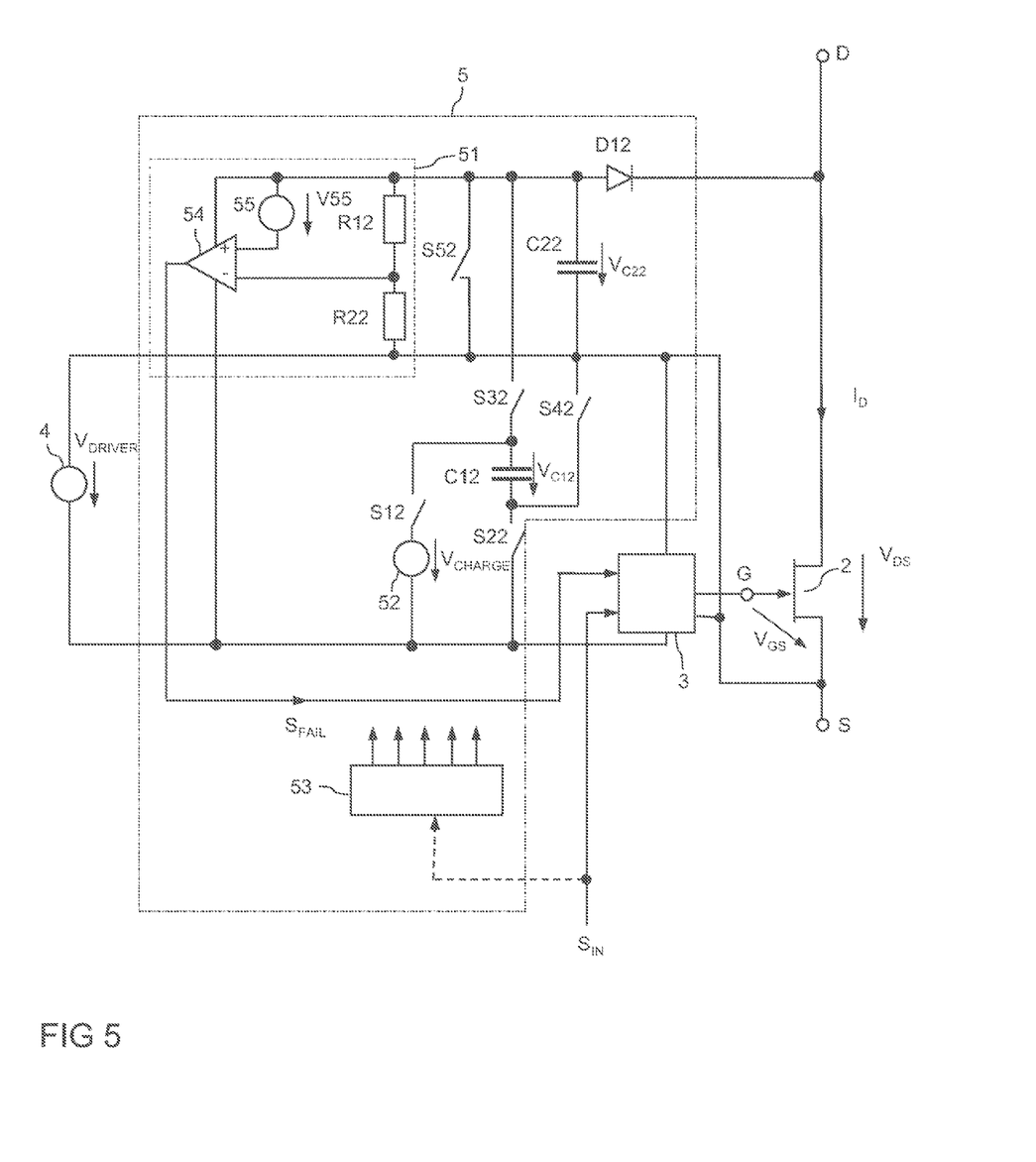
FIG. 5 illustrates a first embodiment of a measure and compare unit of the monitoring circuit.

FIG. 5 illustrates a first embodiment of the measure and compare unit 51. The measure and compare unit of FIG. 5 includes a resistive voltage divider with a first voltage and a second voltage divider resistor R12, R22 connected in series, with the series circuit with the voltage divider resistors R12, R22 connected in parallel with the second capacitive storage element C22. A tap of the voltage divider is coupled to a first input of a comparator 54 that receives a reference voltage V55 at second input. Just for illustration purposes it is assumed that the first input is a inverting, while the second input is an non-inverting input. The failure signal $S_{FAIL}$ is available at the output of the comparator. The reference voltage V55 is provided by a reference voltage source 55 that is connected between the first terminal of the second capacitive storage element C22 and the second input of the comparator 54.

The comparator 54 compares the electrical potential at the first input terminal, which is the electrical potential at the output of the voltage divider R12, R22, with the electrical potential at the second input terminal. The comparator generates a failure level of the failure signal $S_{FAIL}$ when the electrical potential at the first input terminal is lower than the electrical potential at the second input terminal, that is when $$\frac{R12}{R12 + R22} \cdot V_{C22} \geq V55 \qquad (1a)$$

$$V_{C22} \geq \frac{V55}{\frac{R12}{R12 + R22}}. \qquad (1b)$$

In inequations (1a) and (1b) R21 and R22 denote the resistances of the resistors of the voltage divider.

The failure level of the failure signal is a high signal level in the embodiment of FIG. 5. Referring to explanation provided above, the monitoring circuit 5 generates a failure level of the failure signal $S_{FAIL}$ when the voltage $V_{C22}$ across the second capacitive storage element C22 reaches the reference voltage $V_{REF}$. In the embodiment of FIG. 5, the reference voltage corresponds to the load voltage $V_{DS}$ (plus the forward voltage of the diode D12) represented by the term on the right side in inequation (1b) and can be adjusted through the reference voltage V55 provided by the reference voltage source 55 and the resistances of the voltage divider resistors.

Figure 6:
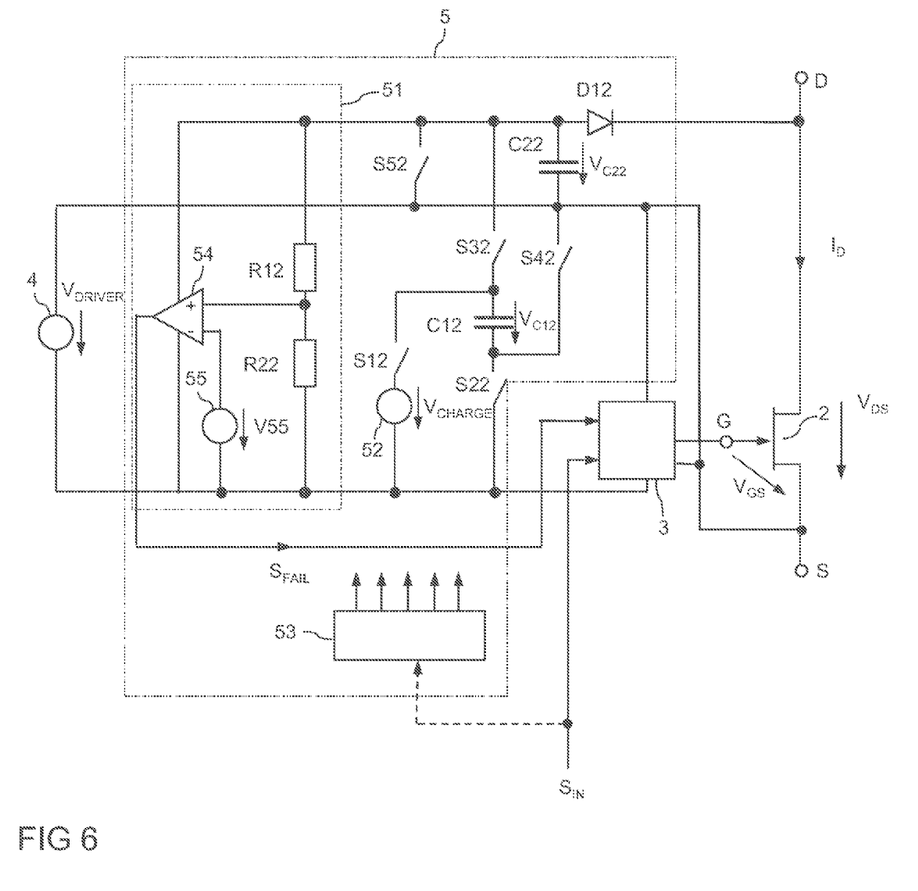
FIG. 6 illustrates a second embodiment of a measure and compare unit of the monitoring circuit.

FIG. 6 illustrates a further embodiment of a measure and compare unit 51. The measure and compare unit 51 of FIG. 6 is a modification of the measure and compare unit of FIG. 5 so that in the following only the differences are explained. In the measure and compare unit of FIG. 6, the voltage divider is connected in parallel between with series circuit with the second capacitive storage element C22 and the supply voltage source 4. A tap of the voltage divider is coupled to a first input terminal that receives the reference voltage V55 at second input. Just for illustration purposes it is assumed that the first input is a non-inverting, while the second input is an inverting input. The failure signal $S_{FAIL}$ is available at the output of the comparator. The reference voltage V55 is provided by a reference voltage source that is connected between negative supply terminal of the supply voltage source 4 and the second input of the comparator 54.

The comparator 54 compares the electrical potential at the first input terminal, which is the electrical potential at the output of the voltage divider R12, R22, with the electrical potential at the second input terminal. The comparator generates a failure level of the failure signal $S_{FAIL}$ when the electrical potential at the first input terminal is higher than the electrical potential at the second input terminal, that is when $$\frac{R22}{R12+R22} \cdot (V_{C22} + V_{DRIVE}) \geq V55 \quad (2a)$$

$$V_{C22} \geq \frac{V55}{\frac{R22}{R21+R22}} - V_{DRIVE}. \quad (2b)$$

In inequations (2a) and (2b) R21 and R22 denote the resistances of the resistors of the voltage divider.

The failure level of the failure signal is a high signal level in the embodiment of FIG. 6. Referring to explanation provided above, the monitoring circuit 5 generates a failure level of the failure signal $S_{FAIL}$ when the voltage $V_{C22}$ across the second capacitive storage element C22 reaches the reference voltage $V_{REF}$. In the embodiment of FIG. 6, the reference voltage corresponds to the load voltage $V_{DS}$ (plus the forward voltage of the diode D12) represented by the term on the right side in inequation (2b) and can be adjusted through the reference voltage V55 provided by the reference voltage source 55, the drive voltage source 4 and the resistances of the voltage divider resistors.

Figure 7:
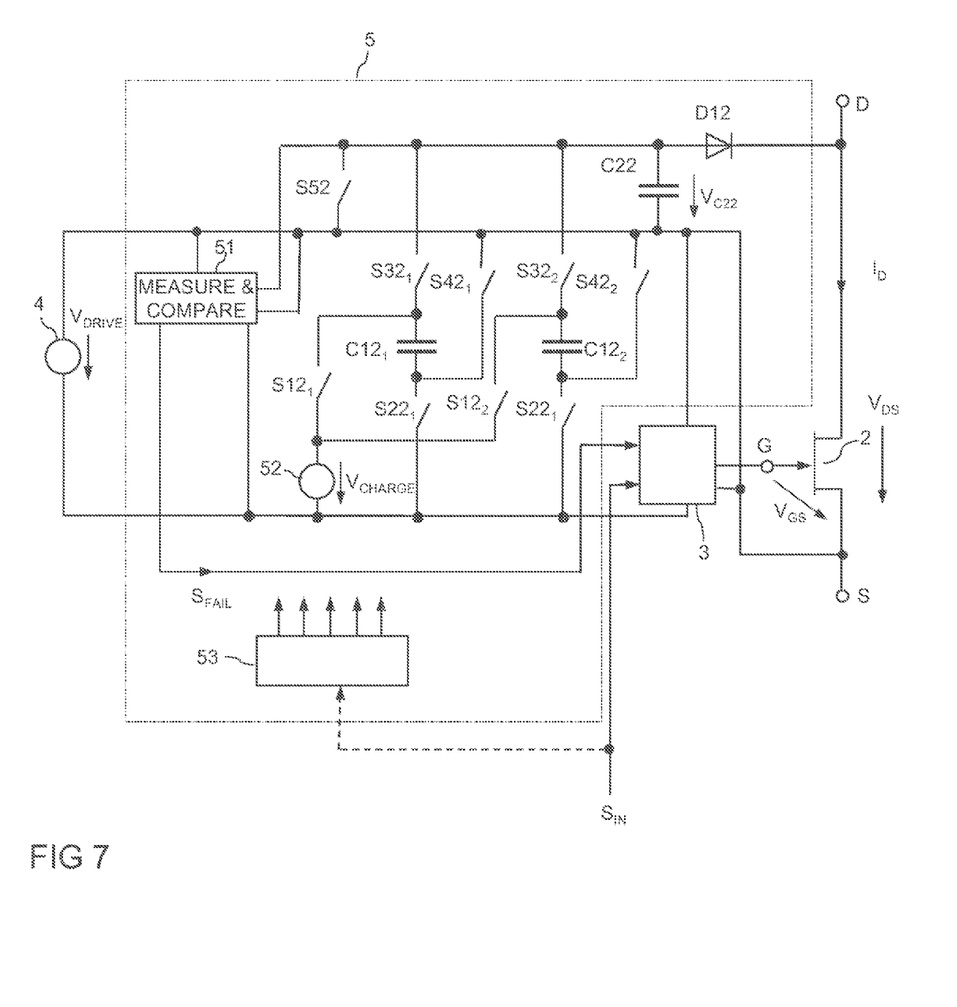
FIG. 7 illustrates the circuit of FIG. 1 implemented with a monitoring circuit according to a second embodiment.

FIG. 7 illustrates a second embodiment of a monitoring circuit 5. The monitoring circuit 5 of FIG. 7 includes several (two in the present embodiment) first capacitive storage elements $C12_1$, $C12_2$. Each of the first capacitive storage elements has a first switch network $S12_1$, $S22_1$ and $S12_2$, $S22_2$, respectively, and a second switch network $S32_1$, $S42_1$ and $S32_2$, $S42_2$, respectively, associated thereto. Each of the first and second switch networks is implemented like the first and second switch networks explained with reference to FIG. 3 herein before. The first switch network of each first capacitive storage element $C12_1$, $C12_2$ is operable to couple the corresponding first capacitive storage $C12_1$, $C12_2$ element to the charging voltage source, while the second switch network of each first capacitive storage element $C12_1$, $C12_2$ is operable to couple the corresponding first capacitive storage $C12_1$, $C12_2$ element to the second capacitive storage element.

Each of the first capacitive storage elements $C12_1$, $C12_2$ serves to charge the second capacitive storage elements in the same way as the first capacitive storage element C12 explained with reference to FIG. 3. According to one embodiment, the first and second switch networks are operated such that in the first phase of one activation cycle the first capacitive storage elements $C12_1$, $C12_2$ are subsequently coupled to the charging voltage source 52, and are subsequently coupled to the second capacitive storage element, such that only one of the first capacitive storage elements $C12_1$, $C12_2$ is coupled to the charging voltage source 52 at the same time and that only one of the first capacitive storage elements $C12_1$, $C12_2$ is coupled to the second capacitive storage element C22 at the same time.

While the embodiment of FIG. 7 includes only two first capacitive storage elements $C12_1$, $C12_2$ it should be noted that more than two first capacitive storage elements each having a first and second switch network associated thereto may be implemented as well. The measure and compare unit 51 can be implemented in accordance with one of the embodiments explained before in connection with FIG. 5 or 6.

Figure 8:
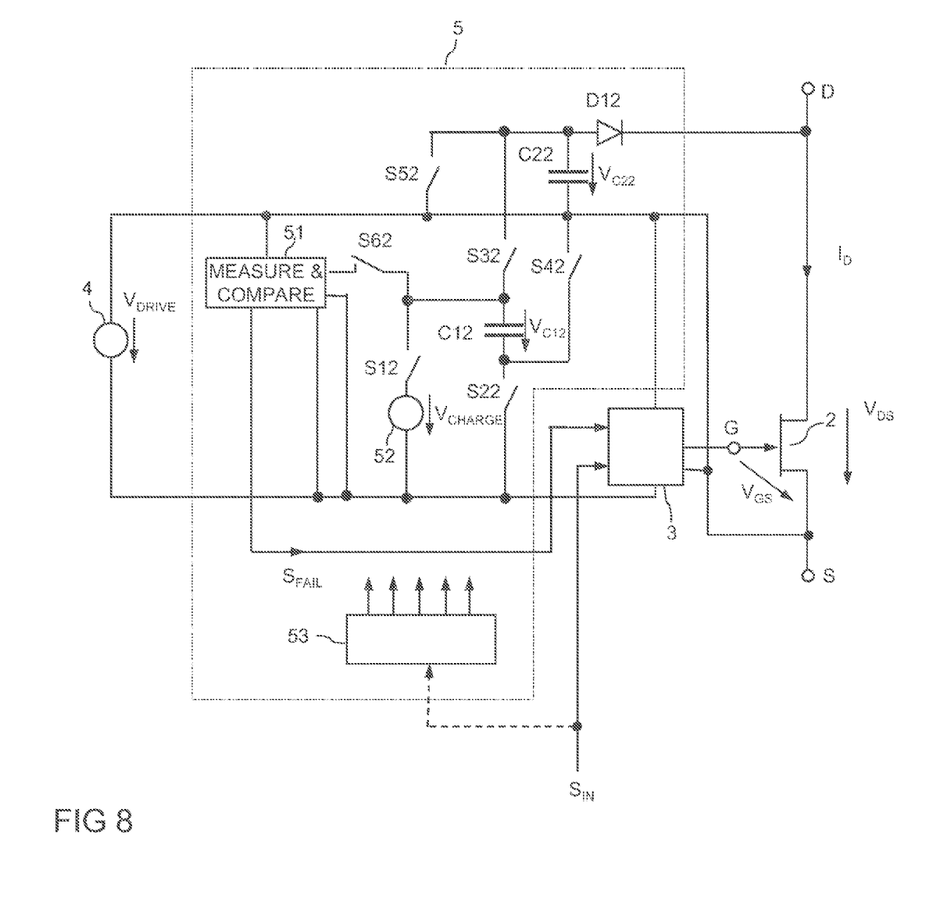
FIG. 8 illustrates the circuit of FIG. 1 implemented with a monitoring circuit according to a further embodiment.

FIG. 8 illustrates a further embodiment of a circuit with an electronic switch 2 and a monitoring circuit 5. The monitoring circuit of FIG. 8 is a modification of the monitoring circuit of FIG. 3 and is different from the monitoring circuit of FIG. 3 in that the measure and compare unit 51 receives the voltage $V_{C12}$ across the first capacitive storage element C12 via a further switching element S62 and compares this voltage with the reference voltage.

In the embodiments explained before, one activation cycle includes two phases, namely a first phase in which the first switch network S12, S22 is activated to charge the first capacitive storage element 12, while the second switch network is deactivated; and a second phase in which the second switch network S32, S42 is activated to couple the first capacitive storage C12 element to the second capacitive storage element C22, while the first switch network is deactivated. In the second phase, the first capacitive storage element C12 is connected in parallel with the second capacitive storage element C22, so that (after a short transient phase) the voltage $V_{C12}$ across the first capacitive storage element C12 corresponds to the voltage across the second capacitive storage element C22, which is the load-path voltage $V_{DS}$ plus the forward voltage of the diode D12.

In the circuit of FIG. 8, one activation cycle includes the first and second phases as explained before, and a third phase after the second phase. In the third phase, the voltage $V_{C12}$ across the first capacitive storage element C12 is evaluated. That is, the voltage $V_{C12}$ across the first capacitive storage element C12 is compared with the reference voltage in the measure and compare unit 51 in the third phase. In the embodiment of FIG. 8, evaluating this voltage $V_{C12}$ includes coupling the voltage across the first capacitive storage element C12 to the measure and compare unit 51 in the third phase, wherein coupling the voltage $V_{C12}$ to the measure and compare unit 51 may include activating (switching on) the further switching element 62 and activating the second switch S22, where the further switch 62 and the second switch S22 form a third switch network. The further switch S62 may be deactivated (switched off) in the first and second phases. However, coupling the voltage $V_{C12}$ to the measure and compare unit 51 only in the third activation cycle is only one of several possibilities to evaluate the voltage $V_{C12}$. According to a further embodiment (not illustrated), the switching element S62 is omitted (replaced by a connection line) and the measure and compare unit 51 is configured to evaluate the voltage $V_{C12}$ only in the third activation cycle to generate the fail signal $S_{FAIL}$.

Figure 9:
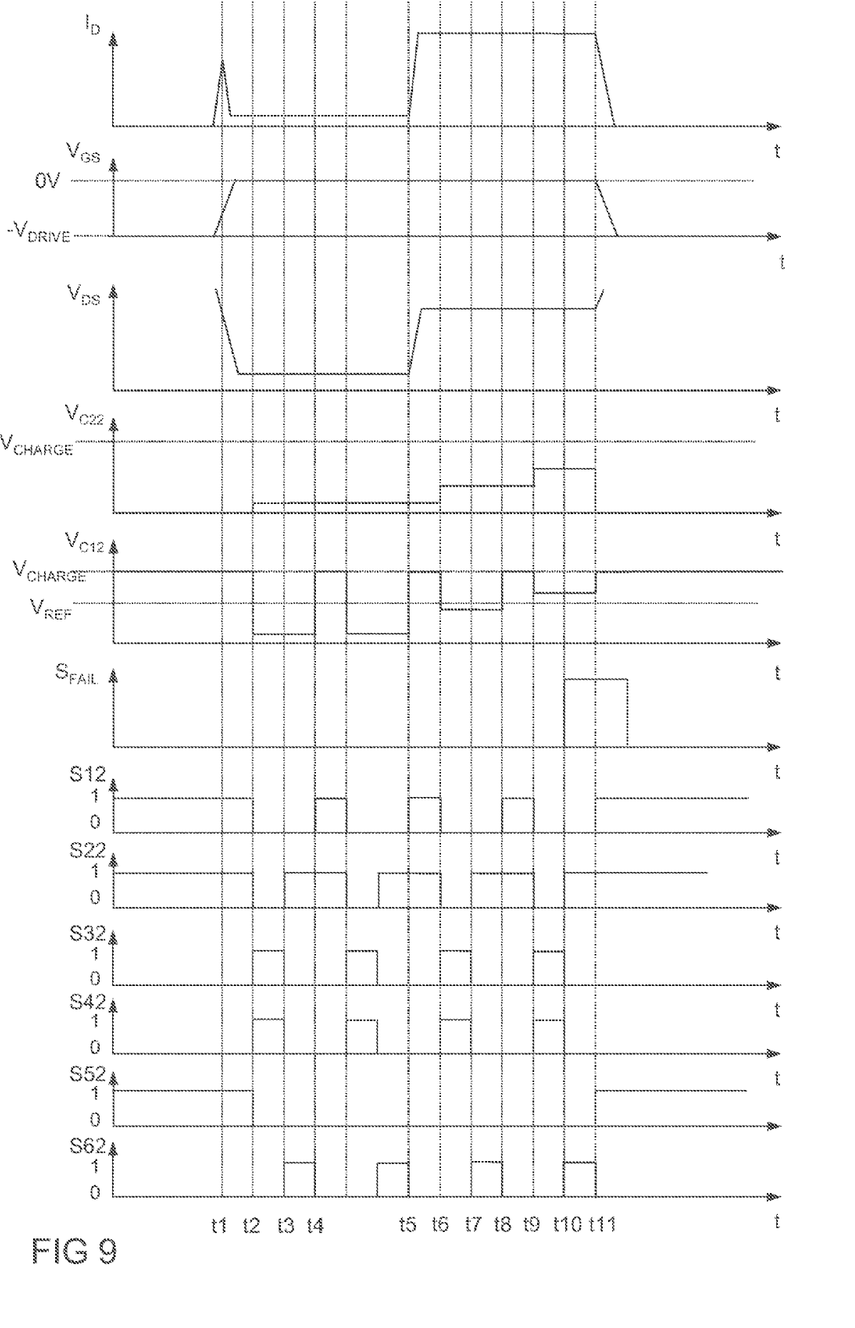
FIG. 9 shows timing diagrams illustrating the operating principle of the circuit of FIG. 7.

The operating principle of the circuit of FIG. 8 is illustrated in FIG. 9 in which timing diagrams of the same signals and switching states as in FIG. 4 are illustrated. Additionally, the switching state of the further switching element S62 is illustrated. In FIG. 9, e.g., the first phase corresponds to a time period between time instances t1 and t2 when the switches S12, S22 of the first switch network are activated, the second phase corresponds to a time period between time instances t2 and t3 when the switches S32, S42 of the second switch network are activated, and the third phase corresponds to a time period between time instances t3 and t4 when the further switch S62 and switch S22 activated. The failure signal assumes a failure after the voltage $V_{C12}$ across the first capacitive storage element C12 reaches the reference voltage $V_{REF}$. This is illustrated at time t10 in FIG. 9.

In the embodiment of FIG. 8, the second capacitive storage element C22 acts as a filter. However, the second capacitive storage element C22 is optional in this embodiment and, like the switch S52, may be omitted. When the second capacitive storage element C22 is omitted, the second switch network S32, S42 serves to couple the first capacitive storage element C12 (via the rectifier element D12) to the load path D-S of the electronic switch 2.

Especially when the circuit is implemented with the second capacitive storage element C12, more than one first capacitive storage element can be implemented in the way explained with reference to FIG. 7.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit, comprising:
    an electronic switch having a control terminal and a load path;
    a monitoring circuit comprising a switched-capacitor circuit with at least one capacitive storage element, the switched-capacitor circuit coupled to the load path of the electronic switch, the monitoring circuit operable to evaluate a load voltage of the electronic switch and to generate a failure signal dependent on the evaluation; and
    a drive circuit operable to provide a drive signal at the control terminal of the electronic switch dependent on the failure signal.

2. The electronic circuit of claim 1, wherein the monitoring circuit further comprises a measure and compare unit operable to receive a voltage across the at least one capacitive storage element, to evaluate the voltage, and to generate the failure signal dependent on the evaluation.

3. The electronic circuit of claim 2, wherein the monitoring circuit further comprises:
    a first capacitive storage element;
    a charging voltage source;
    a first switch network operable to couple the first capacitive storage element to the charging voltage source;
    a second capacitive storage element coupled to the load path of the electronic switch; and
    a second switch network operable to couple the first capacitive storage element to the second capacitive storage element.

4. The electronic circuit of claim 3, wherein the monitoring circuit further comprises a plurality of first capacitive storage elements, each capacitive storage element having associated therewith a first switch network operable to couple the respective first capacitive storage element to the charging voltage source, and a second switch network operable to couple the respective first capacitive storage element to the second capacitive storage element.

5. The electronic circuit of claim 3, further comprising a rectifier element coupling the second capacitive storage element to the load path.

6. The electronic circuit of claim 3, wherein the measure and compare unit receives the voltage across the second capacitive storage element.

7. The electronic circuit of claim 3, further comprising:
    a drive voltage source operable to provide a drive voltage provided to the drive circuit, the drive voltage source connected in series with the second capacitive storage element;
    wherein the measure and compare unit receives a voltage across the series circuit with the second capacitive storage element and the drive voltage source.

8. The electronic circuit of claim 3, wherein the measure and compare unit is operable to generate a failure level of the failure signal when the voltage across the capacitive storage element reaches a reference voltage.

9. The electronic circuit of claim 2, wherein the monitoring circuit further comprises:
a first capacitive storage element;
a charging voltage source;
a first switch network operable to couple the first capacitive storage element to the charging voltage source; and
a second switch network operable to couple the first capacitive storage element to the load path of the electronic switch.

10. The electronic circuit of claim 9, wherein the monitoring circuit further comprises a second capacitive storage element coupled to the load path of the electronic switch.

11. The electronic circuit of claim 9, wherein the monitoring circuit further comprises:
a plurality of first capacitive storage elements, each capacitive storage element having associated therewith a first switch network operable to couple the respective first capacitive storage element to the charging voltage source, and a second switch network operable to couple the respective first capacitive storage element to the second capacitive storage element.

12. The electronic circuit of claim 9, further comprising a rectifier element coupling the second switch network to the load path.

13. The electronic circuit of claim 9, wherein the monitoring circuit is configured to evaluate a voltage across the first capacitive storage element.

14. The electronic circuit of claim 13, wherein the monitoring circuit is configured to evaluate the voltage across the first capacitive storage element only during predefined time instances.

15. The electronic circuit of claim 9, further comprising a third switch network operable to couple the first capacitive storage element to the measure and compare unit.

16. The electronic circuit of claim 1, wherein the electronic switch comprises a normally-on transistor.

17. The electronic circuit of claim 1, wherein the electronic switch comprises a normally-off transistor.

* * * * *